US012575040B2

(12) United States Patent
Sharfi

(10) Patent No.: US 12,575,040 B2
(45) Date of Patent: Mar. 10, 2026

(54) STACKABLE MODULAR ELECTRONIC DEVICE SYSTEM AND ASSOCIATED DEVICES

(71) Applicant: Benjamin K. Sharfi, Rancho Cucamonga, CA (US)

(72) Inventor: Benjamin K. Sharfi, Rancho Cucamonga, CA (US)

( * ) Notice: Subject to any disclaimer, the term of this patent is extended or adjusted under 35 U.S.C. 154(b) by 79 days.

(21) Appl. No.: 17/934,117

(22) Filed: Sep. 21, 2022

(65) Prior Publication Data

US 2023/0097002 A1    Mar. 30, 2023

Related U.S. Application Data

(60) Provisional application No. 63/366,162, filed on Jun. 10, 2022, provisional application No. 63/366,161, filed on Jun. 10, 2022, provisional application No. 63/246,524, filed on Sep. 21, 2021, provisional application No. 63/246,594, filed on Sep. 21, 2021, provisional application No. 63/246,625, filed on Sep. 21, 2021, provisional application No. 63/246,513, filed on Sep. 21, 2021, provisional application No. 63/246,611, filed on Sep. 21, 2021, provisional application No. 63/246,600, filed on Sep. 21, 2021, provisional application No. 63/246,619, filed on Sep. 21, 2021, provisional application No. 63/246,516, filed on Sep. 21, 2021, provisional application No. 63/246,522, filed on Sep. 21, 2021, provisional application No. 63/246,621, filed on Sep. 21, 2021.

(51) Int. Cl.
*H05K 5/02*      (2006.01)
*H05K 7/20*      (2006.01)

(52) U.S. Cl.
CPC ....... *H05K 5/0217* (2013.01); *H05K 7/20409* (2013.01); *H05K 7/20436* (2013.01)

(58) Field of Classification Search
CPC ............. H05K 5/0217; H05K 7/20409; H05K 7/20436; H05K 5/0021
See application file for complete search history.

(56) References Cited

U.S. PATENT DOCUMENTS 4,123,129 A    10/1978    Butler
5,227,957 A    7/1993    Deters
(Continued)

FOREIGN PATENT DOCUMENTS

DE    102009022554    12/2010
EP    0889681    1/1999

OTHER PUBLICATIONS

International Application No. PCT/US22/076810—Patent Cooperation Treaty PCT International Search Report—Completed Dec. 19, 2022 (mailed Jan. 20, 2023).
(Continued)

*Primary Examiner* — Allen L Parker
*Assistant Examiner* — Keon Kim
(74) *Attorney, Agent, or Firm* — Lott & Fischer, PL

(57) ABSTRACT

A modular electronic device is formed from a plurality of stackable hexagonal or rectangular-shaped modules. Each module is locked to another adjacent unit with an indented groove inserted through their sidewalls. Each hexagonal or rectangular module can be made of one or four extrusion elements which then can be stacked in a honeycomb or brick wall configuration.

6 Claims, 21 Drawing Sheets

(56)                    References Cited

U.S. PATENT DOCUMENTS

| | | | | |
|---|---|---|---|---|
| 5,251,106 | A | 10/1993 | Hui | |
| 5,568,356 | A * | 10/1996 | Schwartz | H05K 7/023 |
| | | | | 361/679.01 |
| 5,737,189 | A | 4/1998 | Kammersgard et al. | |
| 8,056,289 | B1 | 11/2011 | Konstantin | |
| 8,755,192 | B1 * | 6/2014 | Schrempp | H05K 7/1495 |
| | | | | 361/752 |
| 9,395,767 | B2 * | 7/2016 | McCabe | H05K 7/1487 |
| 9,468,093 | B2 * | 10/2016 | Peterson | H05K 1/0278 |
| 9,854,695 | B1 * | 12/2017 | Prabhakar | H05K 7/1487 |
| 11,711,904 | B2 * | 7/2023 | Rehak | H05K 7/20154 |
| | | | | 361/692 |
| 2002/0097563 | A1 * | 7/2002 | Costner | G06F 1/18 |
| | | | | 361/735 |
| 2005/0030712 | A1 * | 2/2005 | Faneuf | H05K 7/20727 |
| | | | | 361/695 |
| 2005/0207134 | A1 * | 9/2005 | Belady | H05K 7/1492 |
| | | | | 361/796 |
| 2007/0230111 | A1 * | 10/2007 | Starr | H05K 7/1487 |
| 2008/0259566 | A1 * | 10/2008 | Fried | H05K 7/20809 |
| | | | | 165/80.4 |
| 2015/0181719 | A1 * | 6/2015 | Vinciarelli | H05K 3/284 |
| | | | | 264/129 |
| 2017/0208701 | A1 * | 7/2017 | Logan | H05K 7/1417 |
| 2017/0265335 | A1 * | 9/2017 | Szeremeta | G06F 1/20 |
| 2019/0190232 | A1 * | 6/2019 | Tayebati | C23F 1/16 |

OTHER PUBLICATIONS

International Application No. PCT/US22/076810—Patent Cooperation Treaty PCT Written Opinion of the International Searching Authority—Dec. 19, 2022 (mailed Jan. 20, 2023).

European Patent Application No. EP 22873839 Supplementary European Search Report and Opinion completed on Jul. 1, 2025 (mailed on Jul. 9, 2025).

* cited by examiner

100

CPU MODULE

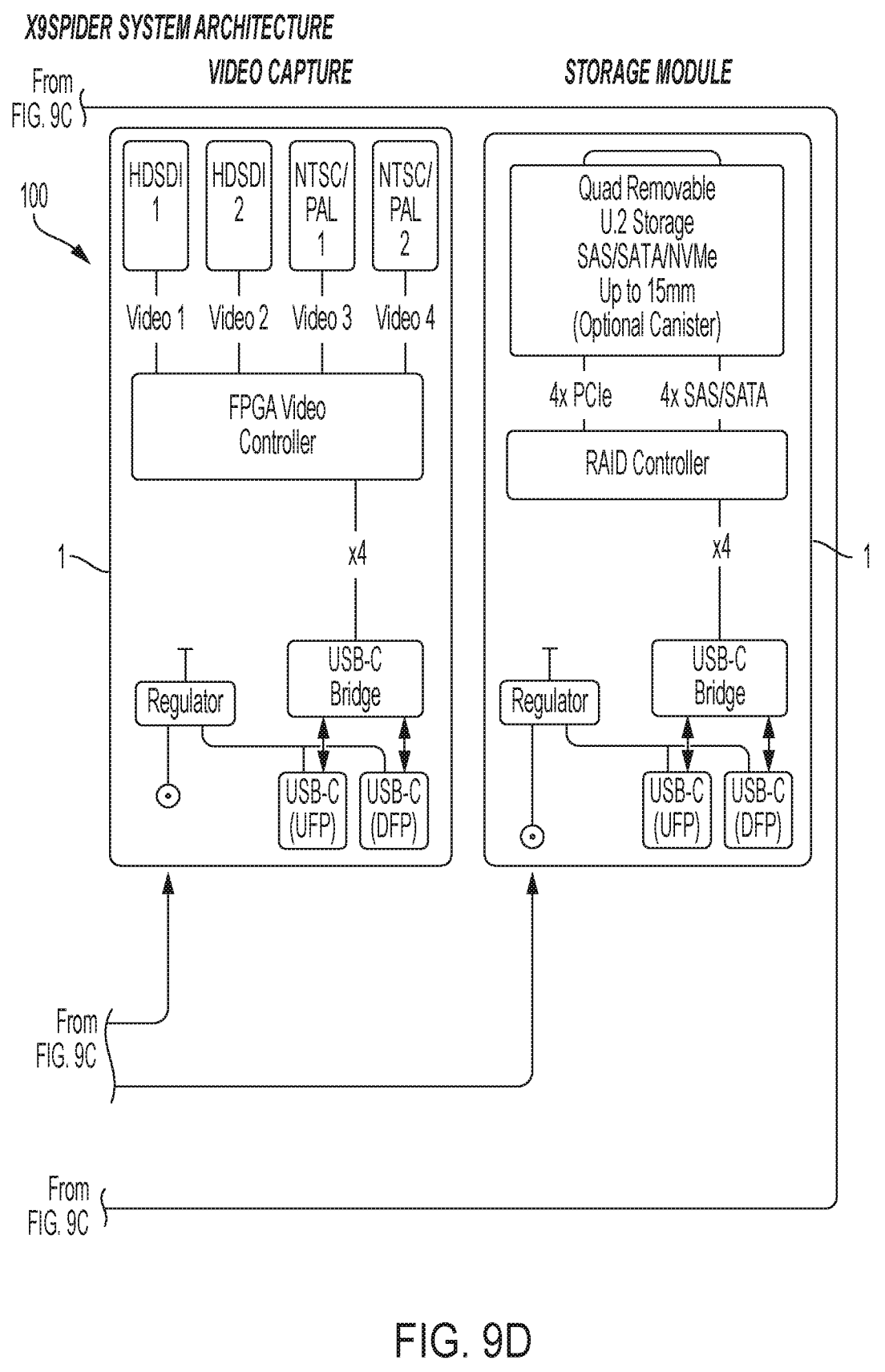

*X9SPIDER SYSTEM ARCHITECTURE*

*VIDEO CAPTURE*                      *STORAGE MODULE*

From FIG. 9C

100

| HDSDI 1 | HDSDI 2 | NTSC/ PAL 1 | NTSC/ PAL 2 |

Video 1   Video 2   Video 3   Video 4

FPGA Video Controller

Quad Removable U.2 Storage SAS/SATA/NVMe Up to 15mm (Optional Canister)

4x PCIe      4x SAS/SATA

RAID Controller x4                   x4

Regulator

USB-C Bridge

Regulator

USB-C Bridge

| USB-C (UFP) | USB-C (DFP) |

| USB-C (UFP) | USB-C (DFP) |

From FIG. 9C

From FIG. 9C

FIG. 9D

Commercial Brick

Rugged Brick

Commercial Brick

Rugged Brick

Commercial Brick

Rugged Brick

Commercial Brick

Rugged Brick

Commercial Brick

Rugged Brick

STACKABLE MODULAR ELECTRONIC DEVICE SYSTEM AND ASSOCIATED DEVICES

CLAIM OF PRIORITY

This application is being filed as a non-provisional patent application under 35 U.S.C. § 111(a) and 37 CFR § 1.53(b). This application claims priority under 35 U.S.C. § 119(e) to U.S. provisional patent application Ser. No. 63/246,513 filed on Sep. 21, 2021, U.S. provisional patent application Ser. No. 63/246,516 filed on Sep. 21, 2021, U.S. provisional patent application Ser. No. 63/246,522 filed on Sep. 21, 2021, U.S. provisional patent application Ser. No. 63/246,524 filed on Sep. 21, 2021, U.S. provisional patent application Ser. No. 63/246,594 filed on Sep. 21, 2021, U.S. provisional patent application Ser. No. 63/246,600 filed on Sep. 21, 2021, U.S. provisional patent application Ser. No. 63/246,611 filed on Sep. 21, 2021, U.S. provisional patent application Ser. No. 63/246,619 filed on Sep. 21, 2021, U.S. provisional patent application Ser. No. 63/246,621 filed on Sep. 21, 2021, U.S. provisional patent application Ser. No. 63/246,625 filed on Sep. 21, 2021, U.S. provisional patent application Ser. No. 63/366,161 filed on Jun. 10, 2022, and U.S. provisional patent application Ser. No. 63/366,162 filed on Jun. 10, 2022, the contents of which are incorporated herein by reference.

FIELD OF INVENTION

The present invention relates to electronic component mounting and interconnection technologies. More specifically, the present invention relates to a system and associated devices for stackable mounting and interconnection of electronic devices using interlocking modules having hexagonal or rectangular profiles.

SUMMARY OF THE INVENTION

This invention relates to an interlocking building block or "brick" element which consists of a hexagonal or rectangular shape with planar and spatial locking mechanisms.

A modular electronic device is formed from a plurality of stackable hexagonal or rectangular-shaped modules. Each module is locked to another adjacent unit with an indented groove inserted through their sidewalls. Each hexagonal or rectangular module can be made of one or four extrusion elements which then can be stacked in a honeycomb or brick wall configuration.

There are notches on the beveled surface of the abutting edges of each module. Half sides of the notches from each module mate with the other half notches of the other module to form a joint with an O-ring to lock the system together to prevent lateral displacement. There are also grooves on the top and bottom sides of each module which allow the modules to slide and lock together.

The system can be electronically integrated into a single unit by daisy-chaining electronic connections between and among the modules. The mechanical interlocking features between the modules also provides a cooling conduction cooling pathway for the efficient cooling and heat transfer of the overall distributed system The integration of modules can be expanded both vertically and horizontally. The modular components and dimensions allow for 3U VPX integration which makes it very versatile. This integrated modular electronic device can be designed as a rugged, commercial, or rackmount system.

BRIEF DESCRIPTION OF THE DRAWINGS

FIGS. 8A-8C, and 9A-9D show schematics of typical network architectures for units that include daisy-chained modules in accordance with the present invention.

DETAILED DESCRIPTION OF THE INVENTION

Following are detailed descriptions of several aspects of the present invention, all of which relate to a system and associated devices for stackable mounting and interconnection of electronic devices using interlocking modules having hexagonal or rectangular profiles.

Figure 1:
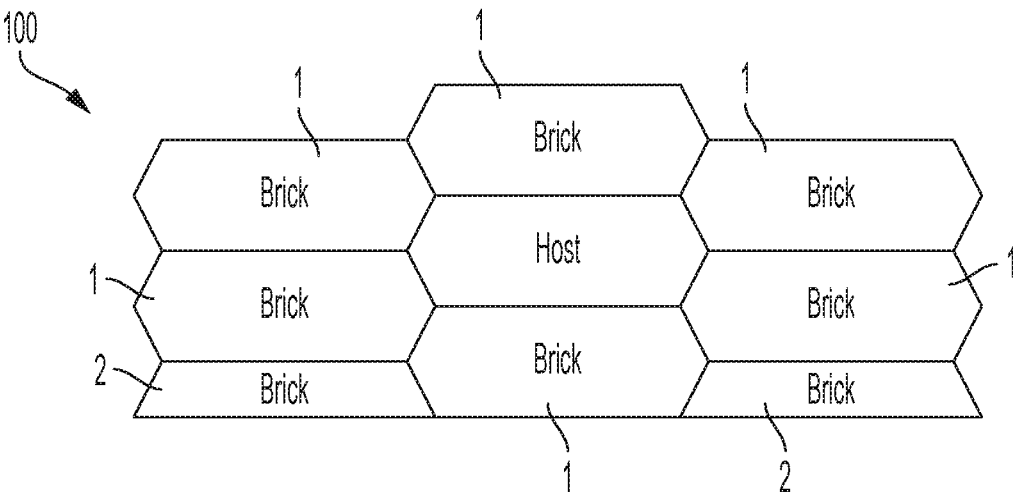
FIGS. 1 and 2 show simplified diagrams of assembled stackable electronic modules according to the present invention in the hexagonal and rectangular interlock configurations.
Figure 2:
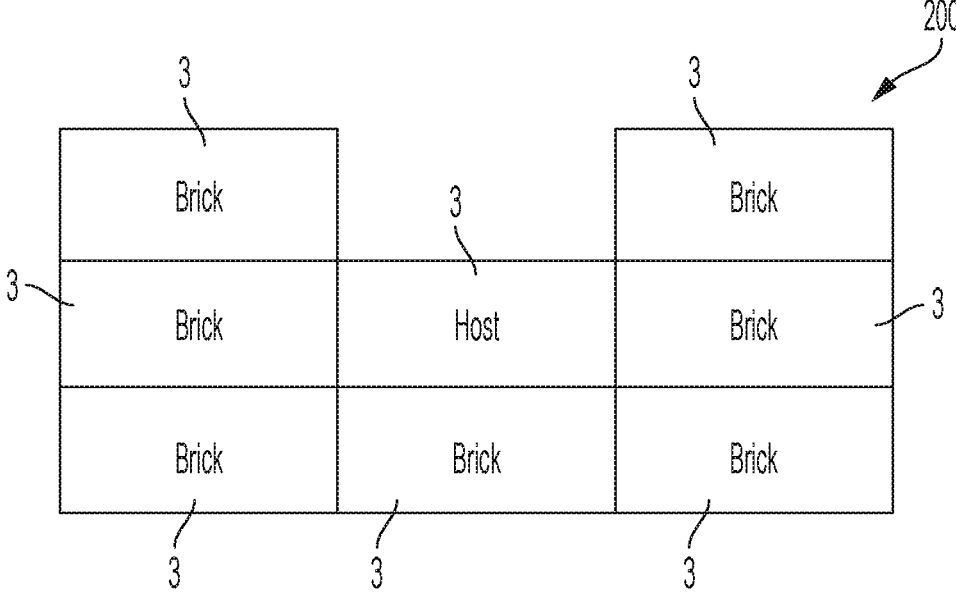

FIGS. 1 and 2 show two examples of configurations according to the present invention. FIG. 1 shows a set (100) of electronic modules, or "bricks" (1) each having a hexagonal cross section in a stacked configuration. In some embodiments of hexagonal stacking modules, half-height modules (2) may be provided for use in the lowest or highest layer in order to provide for a completely flat surface. FIG. 2 shows a set (200) of rectangular modules (3) in a stacked configuration. Although hexagonal and rectangular modules are shown, other shapes, such as square, pentagonal, and heptagonal may be used if they are suitable for stacking.

Figure 3:
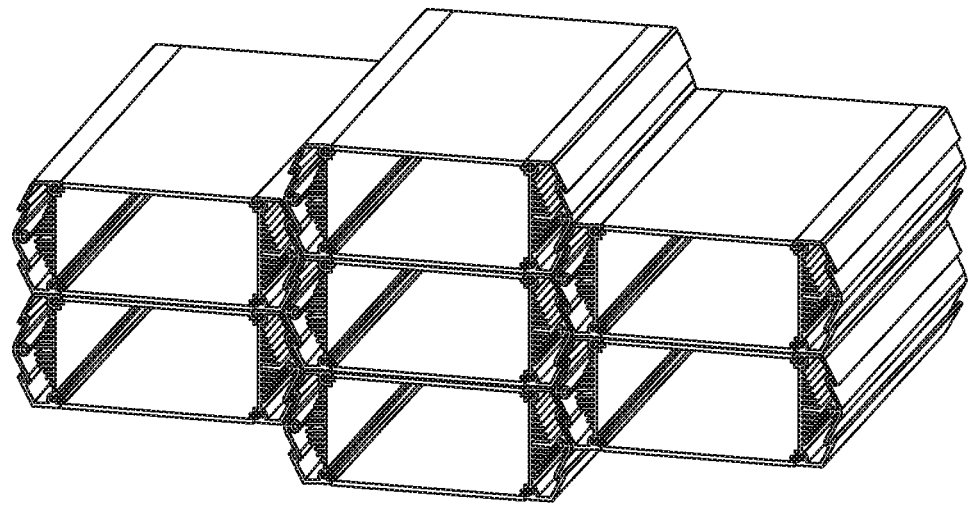
FIGS. 3 and 4 show a rendering of assembled stackable electronic module enclosures according to the present invention in the hexagonal configuration and a detail of the interlocking feature between adjacent modules.
Figure 4:
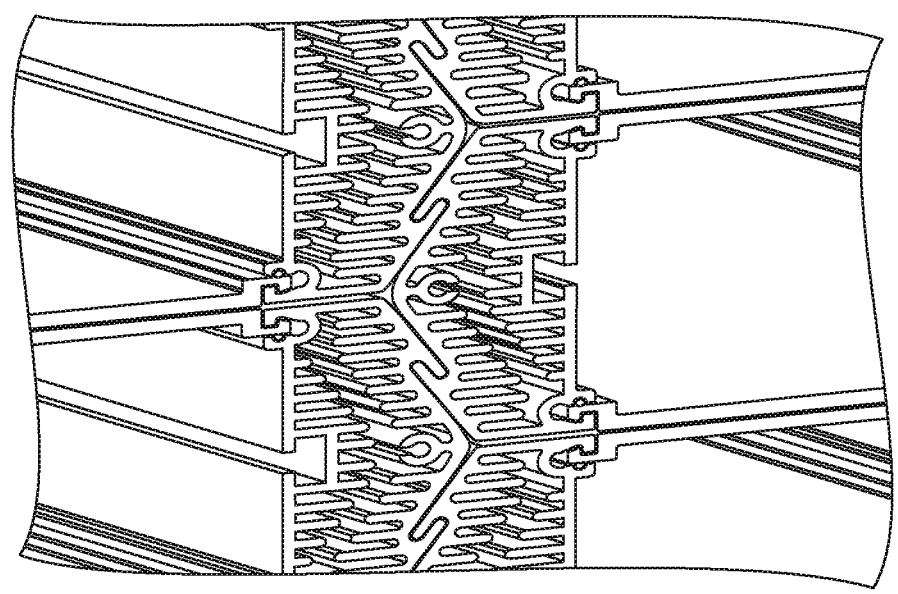
Figure 5:
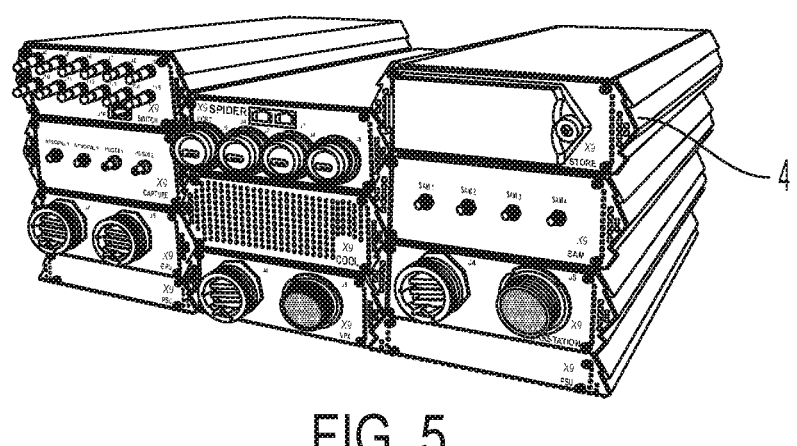
FIGS. 5, 6, and 7 illustrate the front and rear views of a unit composed of assembled stackable electronic modules according to the present invention in the hexagonal configuration, and a network interconnection schematic for the same.
Figure 6:
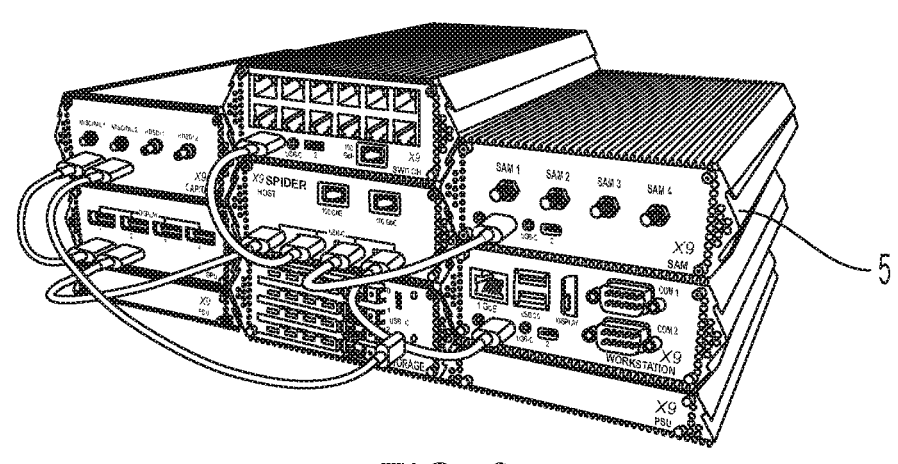
Figure 7:
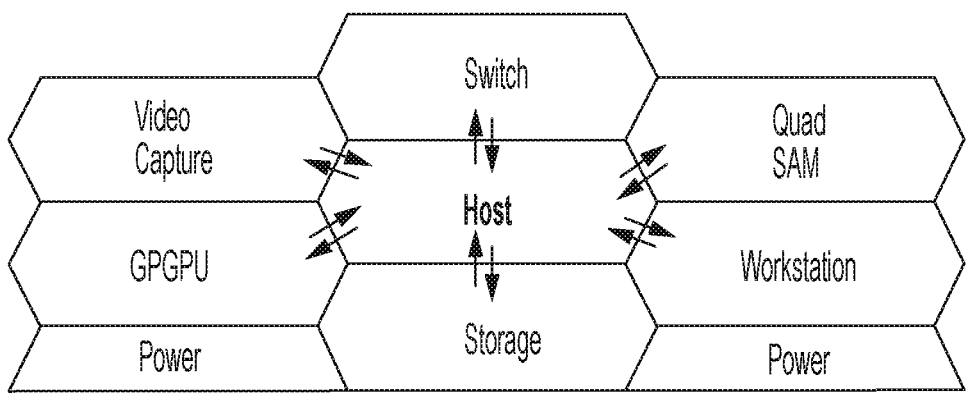
Figure 8A:
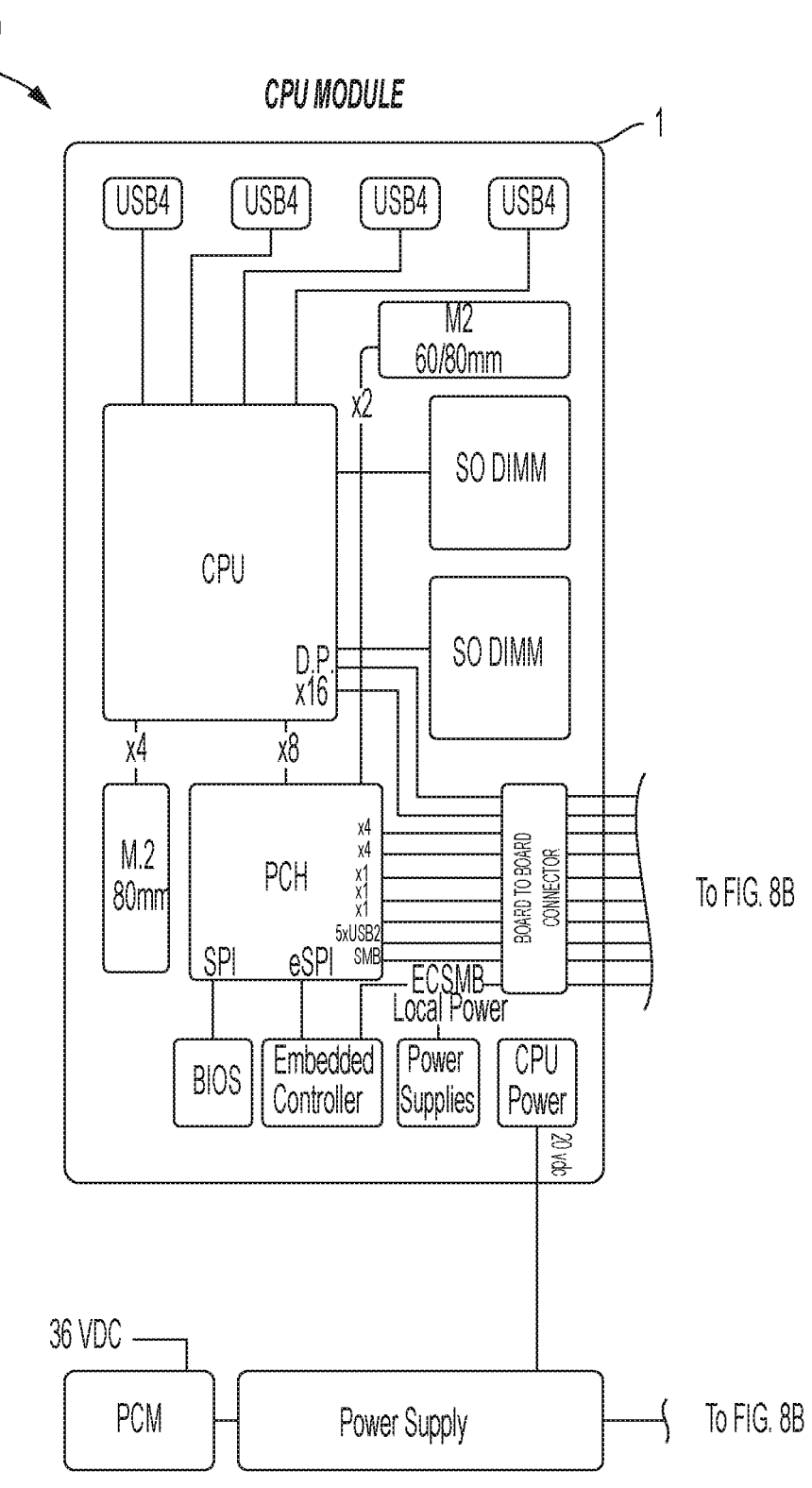
Figure 8B:
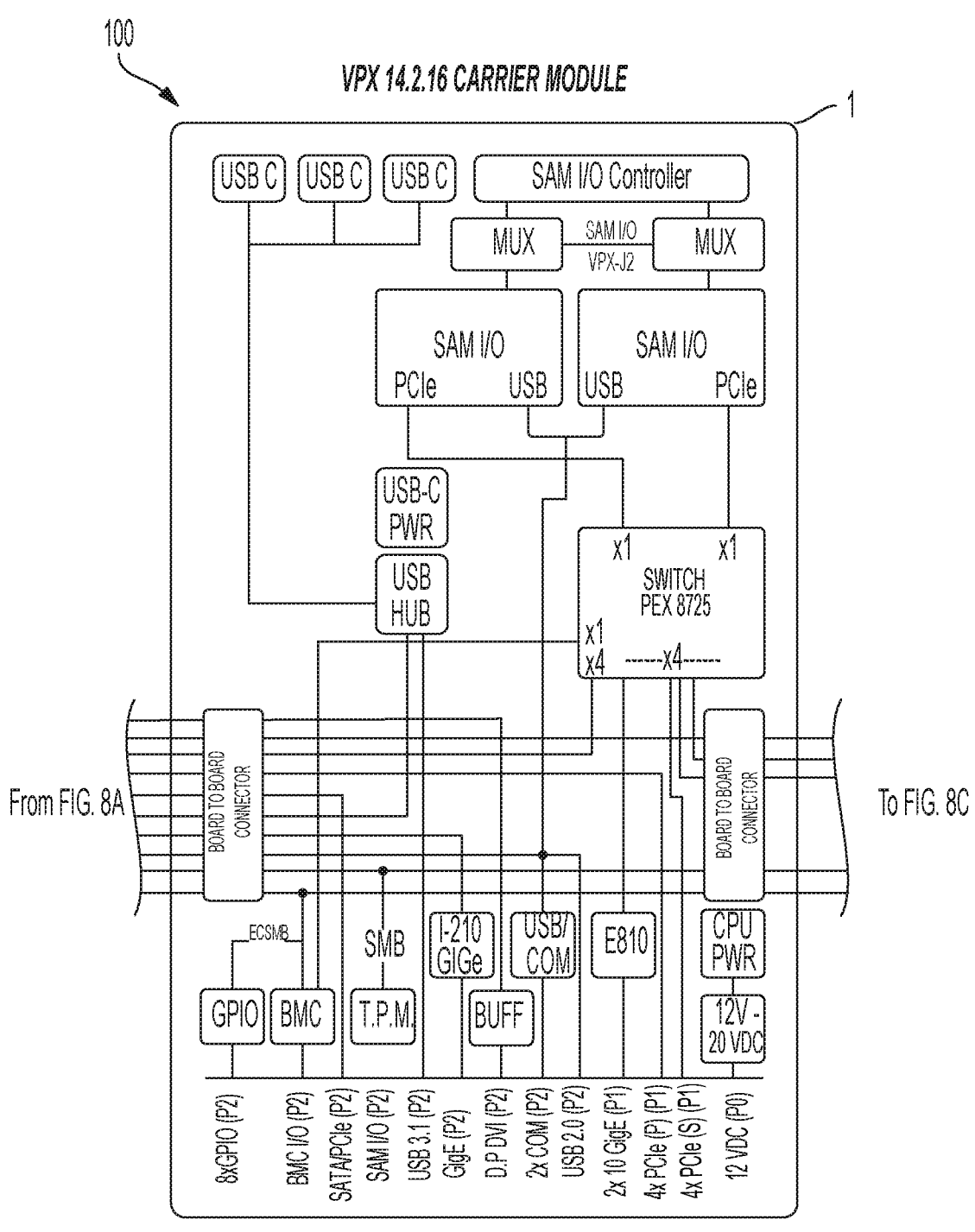
Figure 8C:
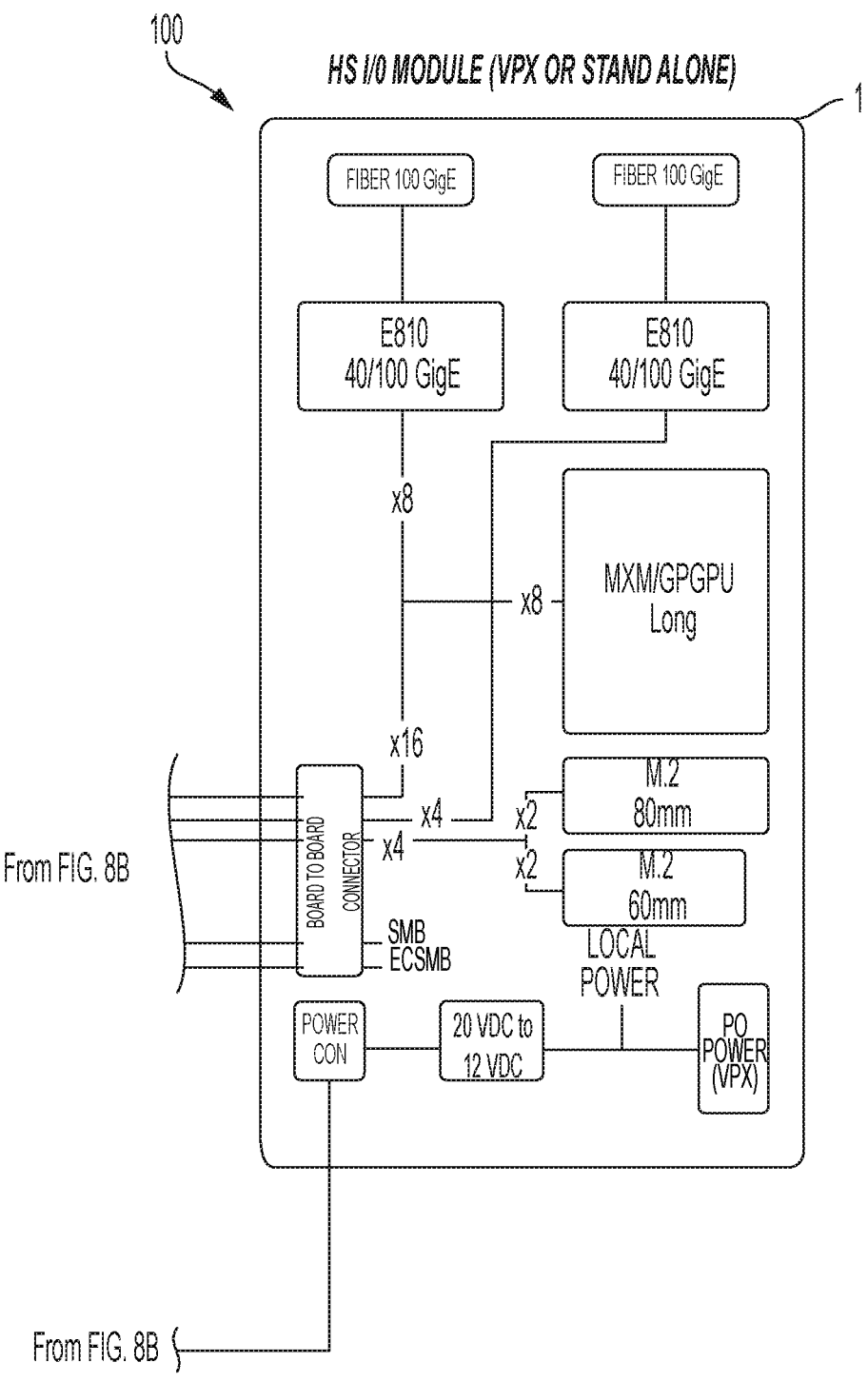
Figure 9A:
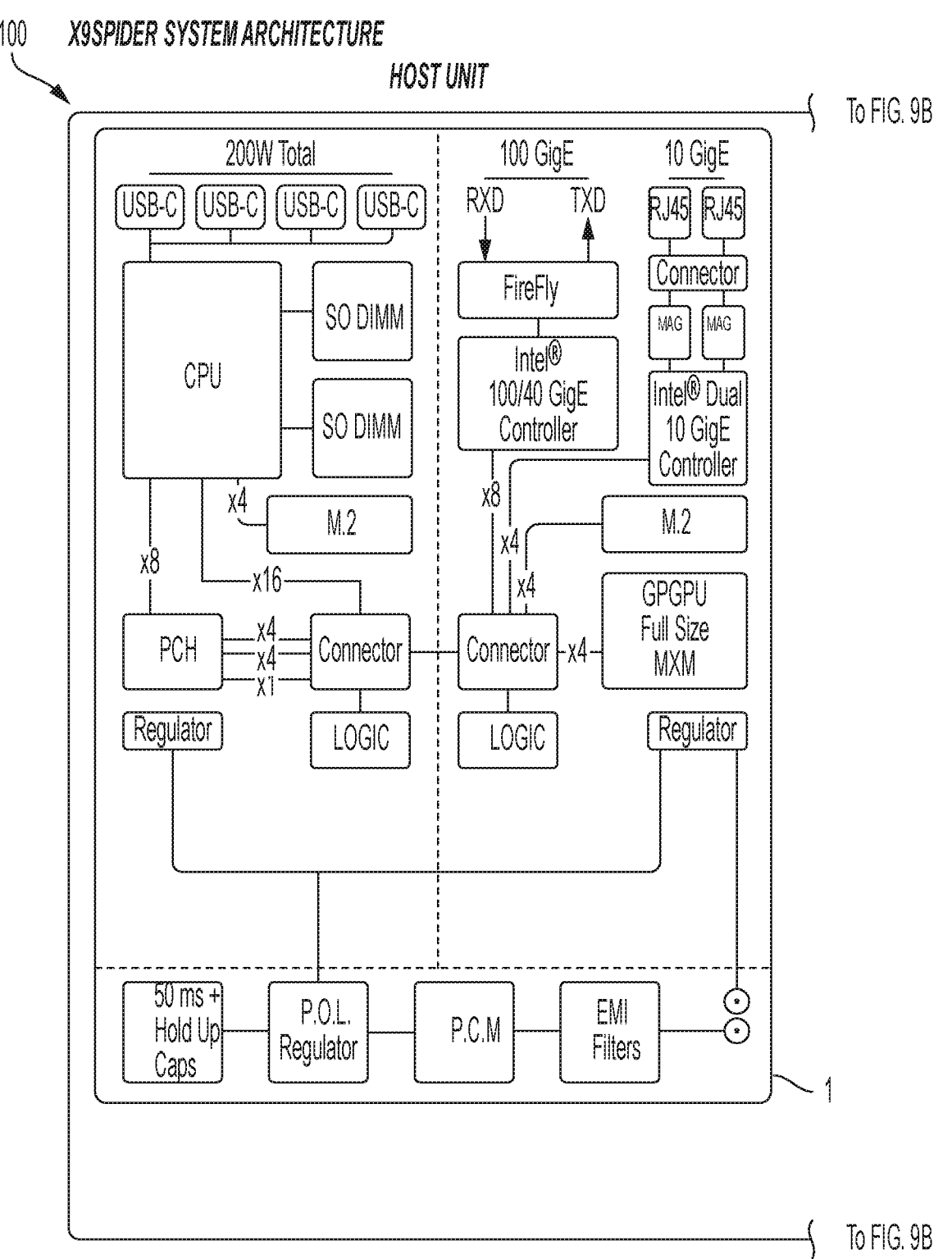
Figure 9B:
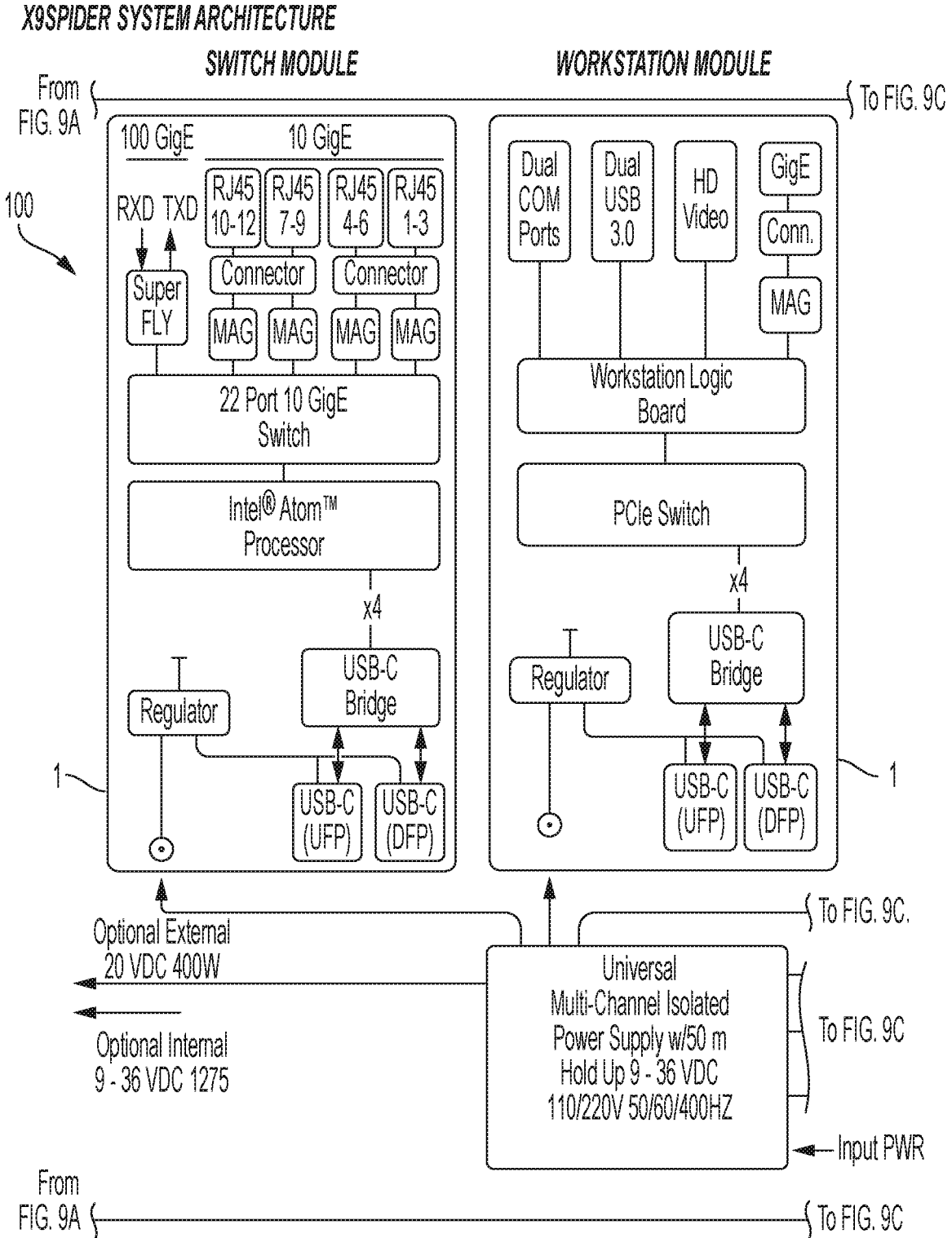
Figure 9C:
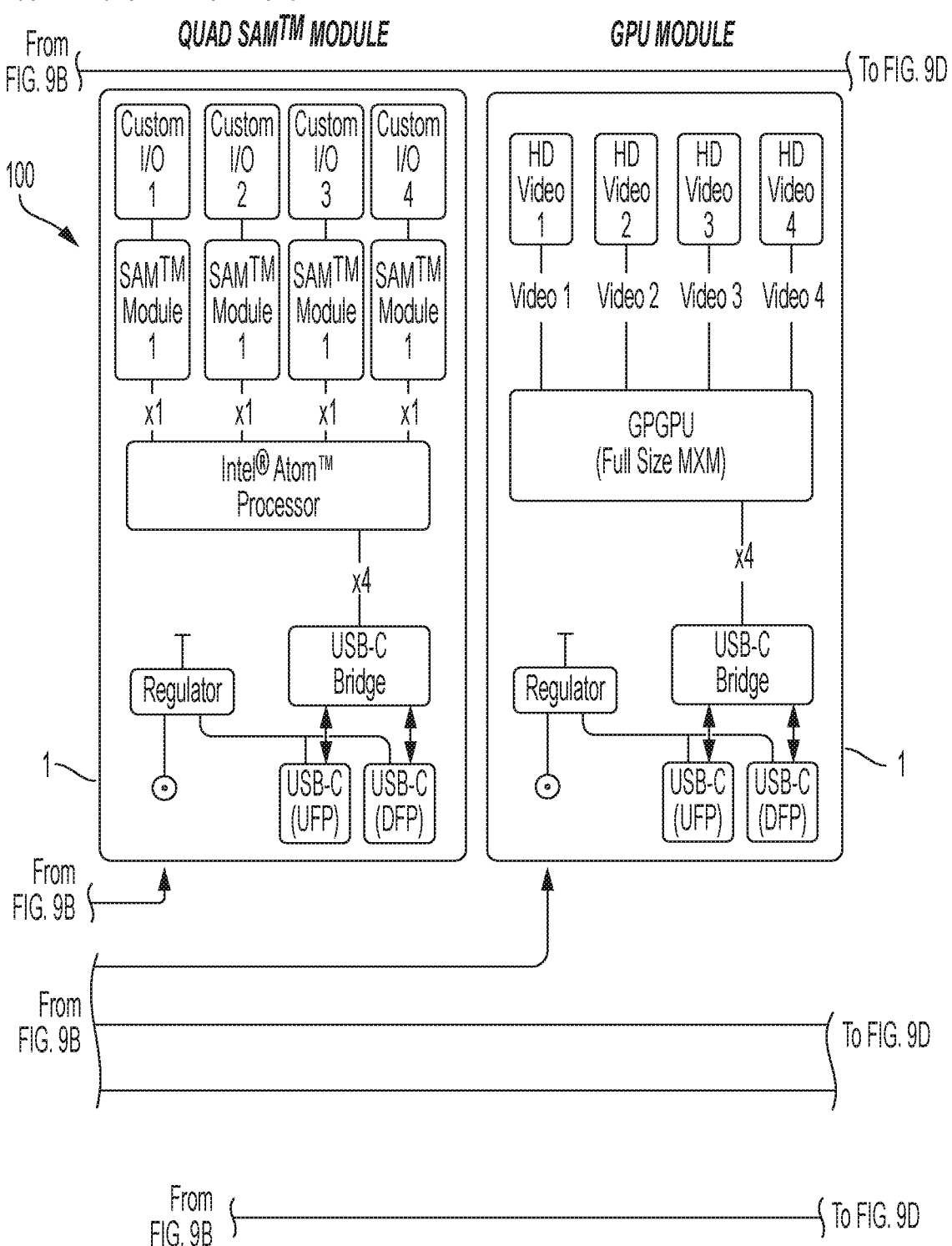

FIG. 3 shows a rendering of assembled stackable electronic module enclosures according to the present invention in the hexagonal configuration. FIG. 4 shows a detail of the interlocking feature between adjacent modules in the stack. Renderings of complete electronic units in the stacked configuration are shown in FIG. 5 (front) and FIG. 6 (back). As represented in FIG. 7, the modules can be interconnected through bi-directional electronic connections resulting in a "daisy-chain" arrangement where each module in the stack is connected with each other module. Alternatively, cables can connect each module directly to one or more other modules.

In this fashion, the integration of modules can be expanded both vertically and horizontally. The modular components and dimensions allow for 3U VPX integration which makes it very versatile. This design is flexible enough to allow for rugged, commercial, or rackmount systems.

A feature of some embodiments of the present invention is that each of the modules can include pathways for conduction cooling. In the examples shown in FIGS. 5 and 6 the rear (5) and front (4) outlets for the cooling pathways can be seen as the perforated grills at the end of each module.

The disclosed modular stacking system is well suited for a decentralized configuration architecture for task processing within a computing system. The disclosed architecture platform improves the utilization rate and efficiency of the computing systems. The module-based decentralized system architecture provides several features and benefits, including without limitation:

1. The peripheral modules can be attached or detached to the host module and amongst one or multiple "brick" modules via daisy-chain configuration or the host can be operated independently depending on the application;
2. Low cost and flexible interconnects without any bulky or heavy cables can be used, providing a richer input/output ("I/O") set which lowers the total cost of ownership by having more peripheral attached to a single system;
3. The ability to add functionality in the field where space and power are limited with easy installation and removal of a system or sub-system;
4. No software drivers to install or update within subsystems which allows for seamless integration and ultra-low latency across the entire platform;
5. No long-distance cabling limitation for video and high-speed I/O data signal transmission with the ability to place modules up to 100 m from the host with the use of fiber and power in one cable which eliminates signal bottlenecks that occur over copper wiring;
6. The ability to achieve an optimized heat dissipation with the conduction interlock cooling mechanism; and
7. A unique distributed or external power supply management with an embedded system controller for voltage and temperature monitoring.

Schematics showing examples of architectures that are enabled by the disclosed stackable module system are shown in FIGS. 8A-8C and 9A-9D.

Figures 10, 11:
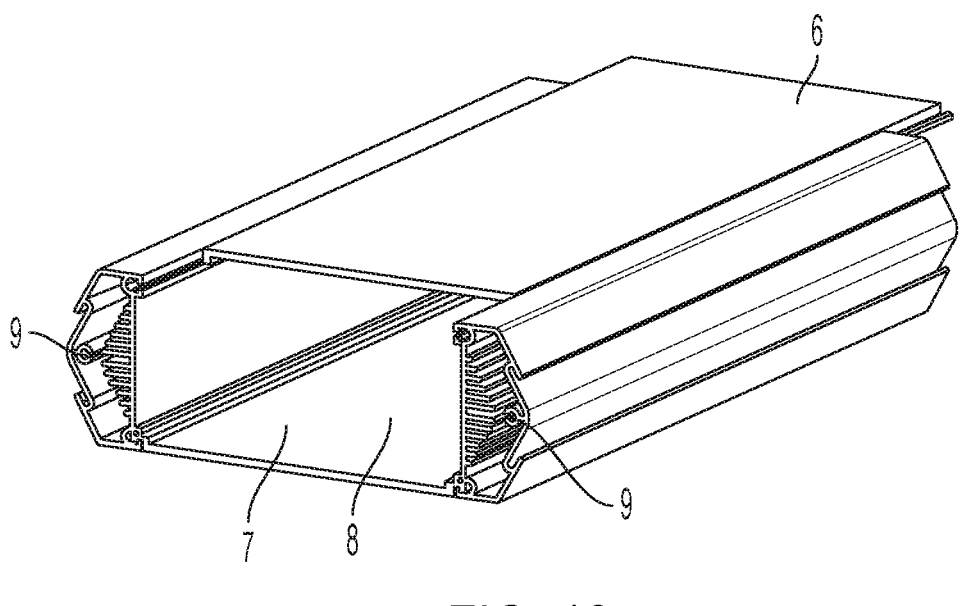
FIG. 10 shows a rendering of a hexagonal stackable modular enclosure according to the present invention with the front cover removed.
FIG. 11 shows a rendering of front panel cover for a hexagonal stackable modular enclosure according to the present invention.
Figure 12:
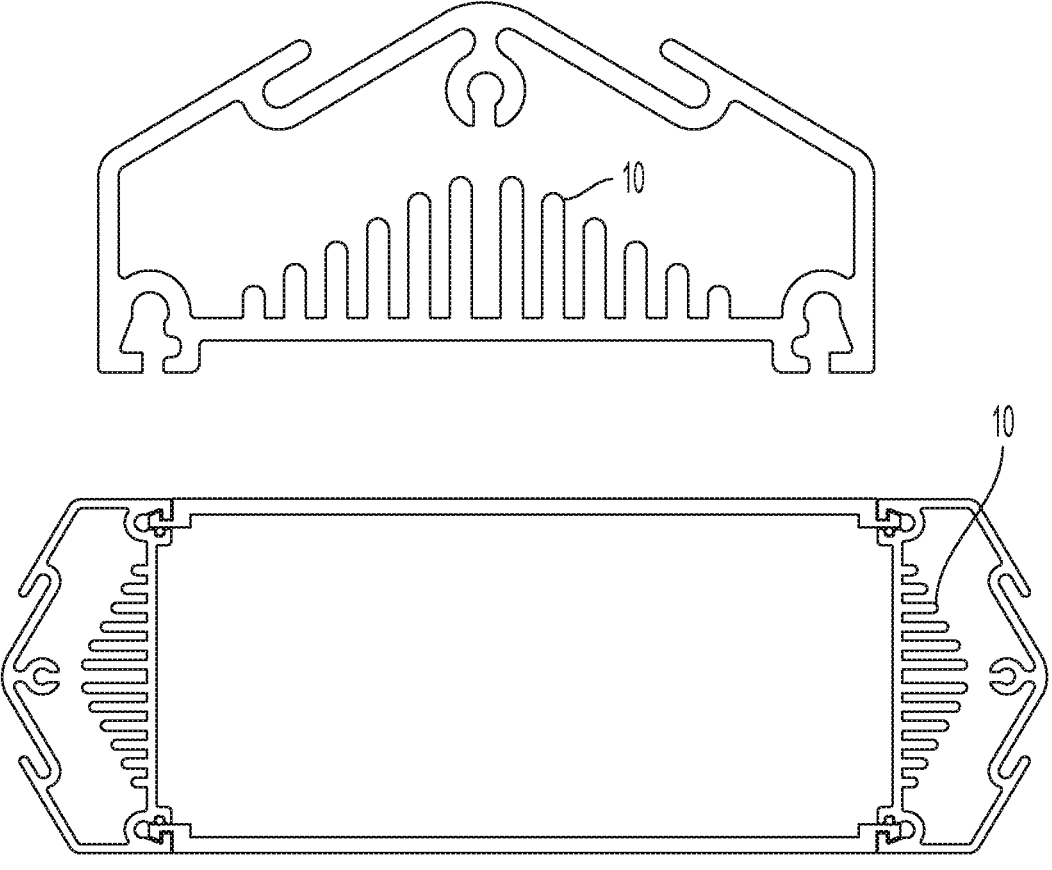
FIG. 12 shows cross-sectional views of a hexagonal stackable modular enclosure according to the present invention that illustrates the cooling fins and capillaries therein.
Figure 13:
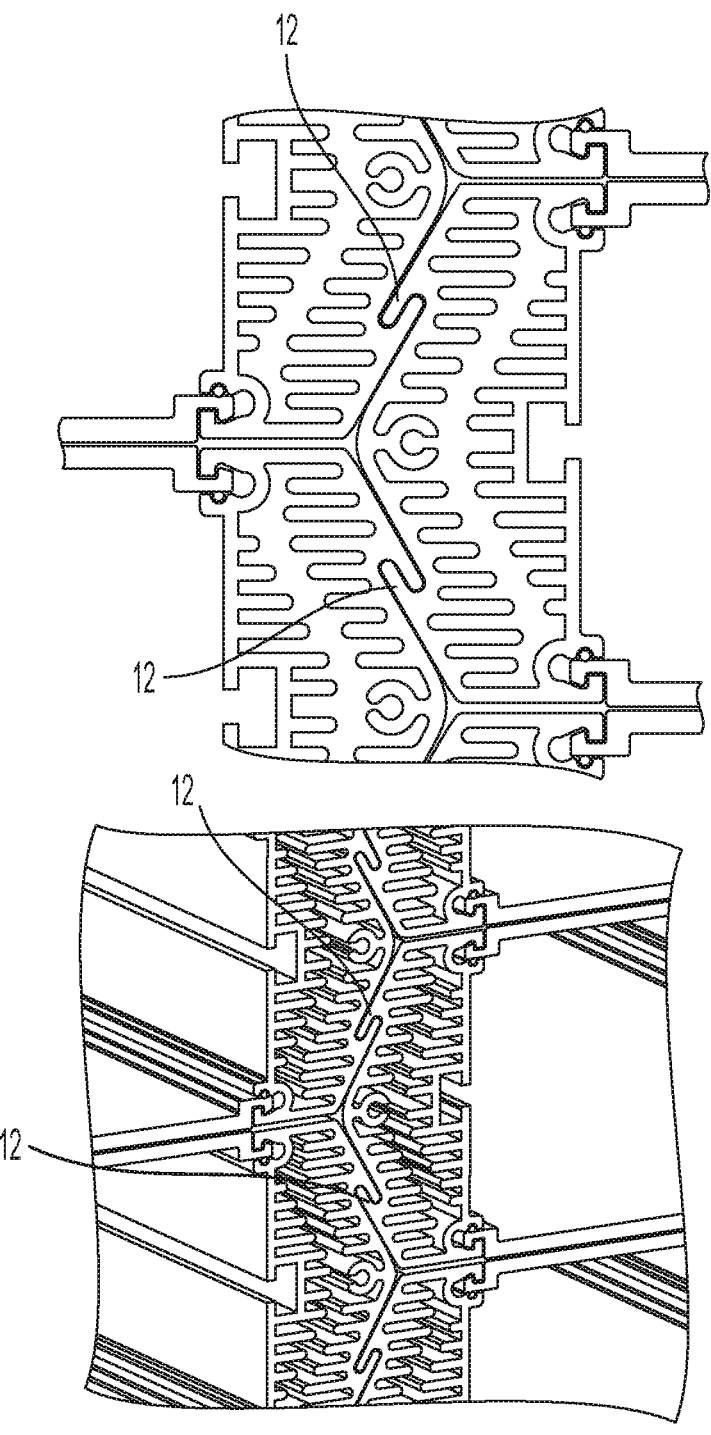
FIG. 13 shows detail views of the interlocking feature between adjacent modules cross-sectional views of a hexagonal stackable modular enclosure according to the present invention that also illustrates the cooling fins and capillaries therein.

Detailed views of typical hexagonal enclosures according to the present invention are shown in FIGS. 10-13. As shown in FIG. 10, the typical module enclosure has removable top (6) and bottom (7) surfaces that are slidable for ease of access to the orthogonal electronic equipment bay (8). On each side of the module there is a cooling passageway (9) which has fins and capillary structures to optimize cooling of the equipment inside the enclosure. The cooling fins and capillaries (10) can be most easily seen in the cross-sectional views shown in FIG. 12. Each module has a front and rear panel such as shown in FIG. 11. It will be readily observed that the panel has one or more perforated grilles (11) to permit cooling air to enter the cooling passageways.

As indicated previously, each module has features that allow it to interlock with adjacent modules. These features can be seen in FIG. 13. On each slanted wall, the module has, by way of example, grooves and tongues (12) that allow modules to interlock with ease.

The fins and capillaries, as well as other parts of the enclosure can optionally be coated with diamond composite, or other thermal conductors, for efficient thermal transfer of air travelling through the cooling passageways. The fins arrays are shaped specifically for optimum airflow and conduction cooling. The top and bottom enclosures are slidable for ease of operation during stacking and unstacking of the modules.

Figure 14:
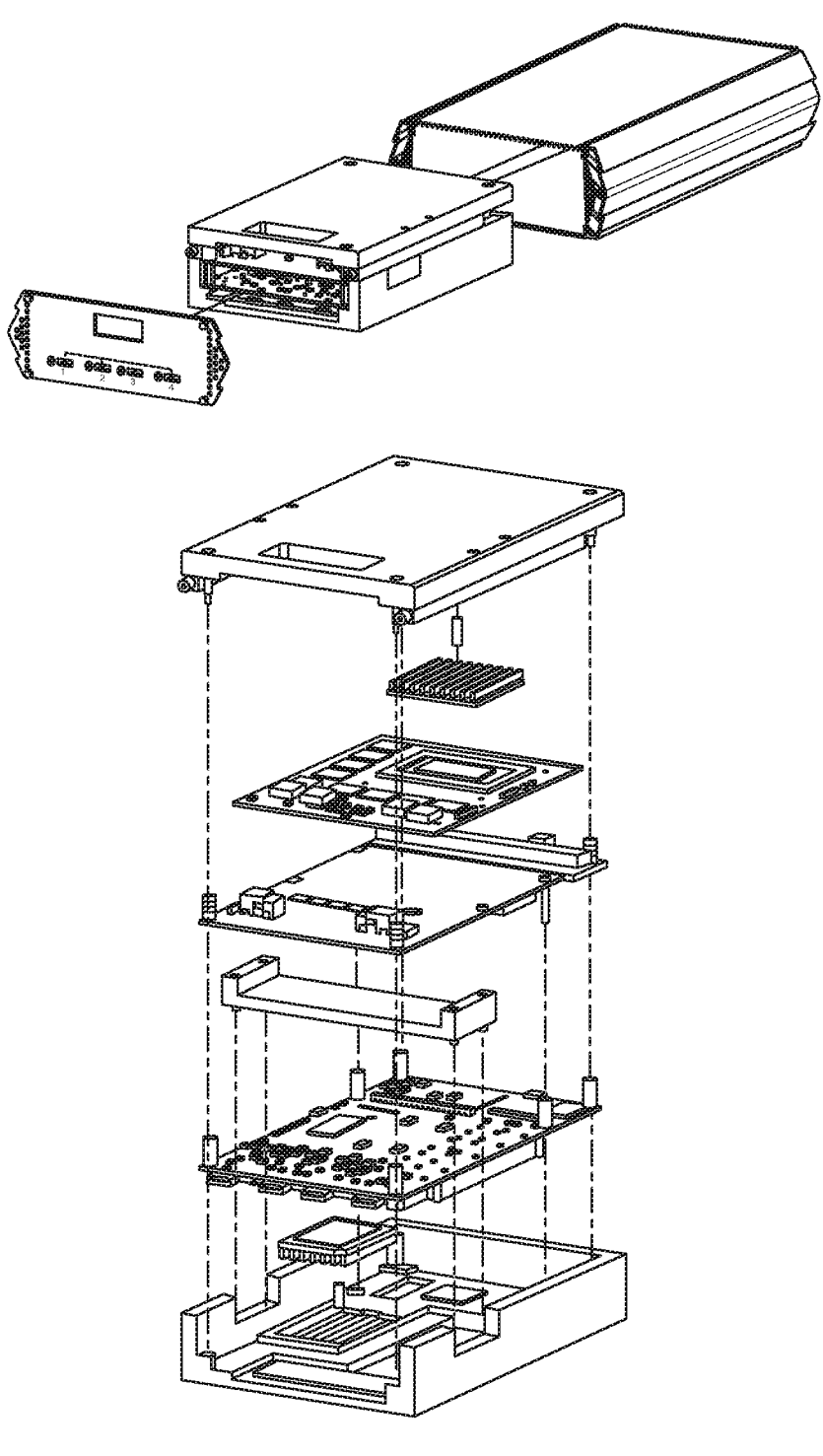
FIG. 14 shows assembly drawings of an electronic device incorporating a heat-dissipating swappable diamond coated cartridge according to some embodiments of the present invention.

As shown in FIG. 14, a module can also optionally include a swappable cartridge coated with a diamond composite, or other efficient thermal transfer material. The cartridge insert contains a board that is swappable inside the extruded housing stackable modules. The swappable cartridge form-factor provides the following advantages:

1. Universal fit across the entire product line means external extrusion can be a single piece and require no secondary machining;
2. Simpler and thinner external extrusion for lower extrusion cost;
3. Ability to easily adapt the mounting and thermal solutions as required for each unique board stack configuration;

Superior thermal dissipation with diamond materials and ease of cooling of individual components; and Easy to assemble and disassemble.

The entire module cartridge and enclosure surface including the heat sink and fins can optionally be encapsulated with a diamond composite coating providing a very smooth, matte, surface. The encapsulation process is achieved by electroless nickel plating with nano-diamond powders. Applying a diamond composite coating on the copper or aluminum metals results in more optimal heat transfer, enhanced corrosion resistance, increased wear resistance, and greater lifetime.

Diamond plates may also optionally be inserted between the copper heat spreader(s) and the heat source(s). The diamond plates can be applied at both ends of the board where heat sources exist thus allow for efficient heat dissipation within the system.

The disclosed system allows for numerous configurations of rugged and/or commercial stackable electronic modules, including, without limitation:

General-purpose graphic processing unit ("GPGPU") modules;

Quad SAM modules;

Storage modules;

Switch modules;

Video capture modules

VPX (VME+PCI+X bus) modules; and

Workstation modules

Examples of these modules are shown in FIGS. 15-21.

Stackable GPGPU Module

The standalone and stackable rugged general-purpose graphic processing unit (GPGPU) module provides high-performance GPGPU via a full-size MXM module.

The module supports up to four heads of high-definition videos.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems. "Ruggedized" in the instant application refers to modules that meet test method standards for environmental engineering considerations and laboratory tests such as MIL-STD and the Ingress Protection (IP) ratings system for operation in harsh environments. "Commercial" in the instant application refers to modules that do not need to meet the ruggedized standards and are designed for operation in less harsh conditions.

Figure 15:
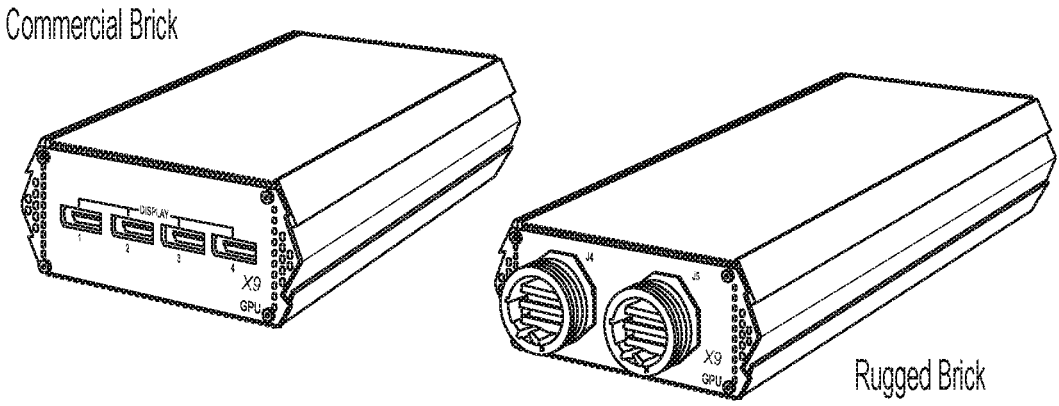
FIG. 15 shows renderings and an electrical schematic for commercial and rugged versions of a stackable GPGPU module according to some embodiments of the present invention.
Figure 15:
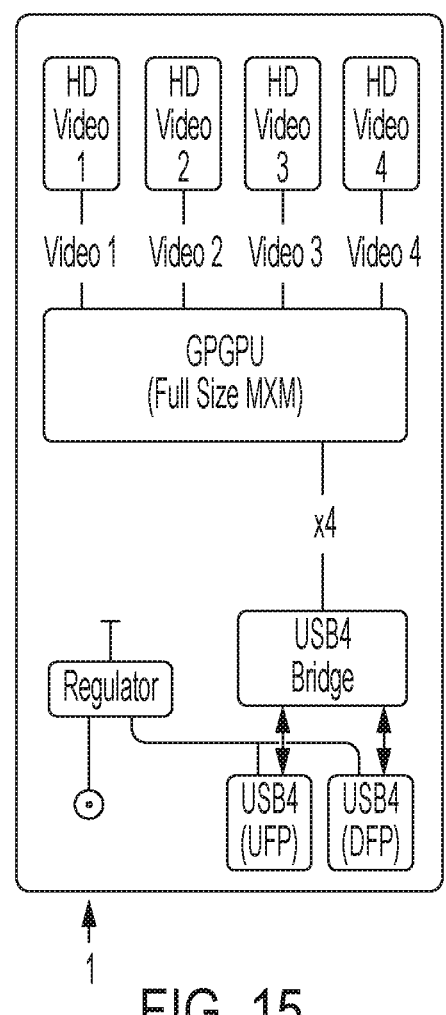

FIG. 15 shows the rendering images of the standalone and stackable GPGPU module in a commercial and rugged brick modular system and an electrical schematic of the standalone and stackable GPGPU module which consists of HD videos, full-size MXM GPGPU, power regulator, and dual USB4 ports.

Stackable Quad SAM Module

The standalone and stackable rugged Quad SAM module is a highly efficient input/output expansion system. It can provide over 90% space efficiency.

The module supports up to four SAM I/O modules with PCIe and USB.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or commercial systems.

Figure 16:
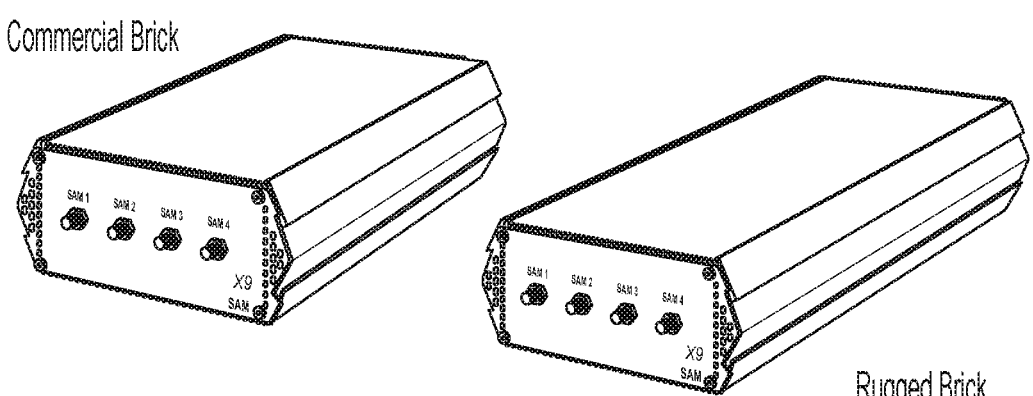
FIG. 16 shows renderings and an electrical schematic for commercial and rugged versions of a stackable QuadSAM module according to some embodiments of the present invention.
Figure 16:
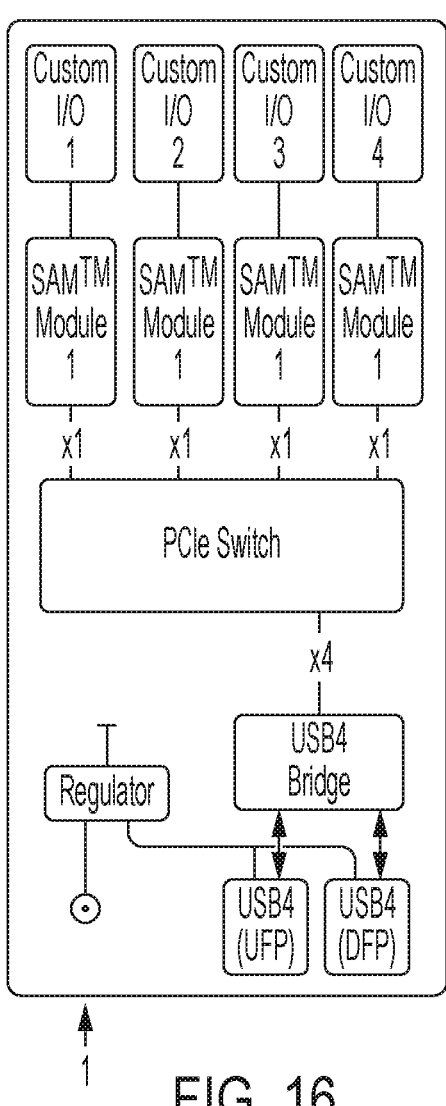

FIG. 16 shows the rendering images of the standalone and stackable Quad SAM module in commercial and rugged brick modular systems. The same figure shows an electrical schematic of the standalone and stackable Quad SAM™ module which consists of custom I/O, SAM™ modules, PCIe switch, power regulator, and dual USB4 ports.

Stackable Storage Module

The standalone and stackable rugged storage module can provide up to four removable SSD SAS/SATA/NVMe drives with an optional removable canister storage system with very high mating cycles.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems.

Figure 17:
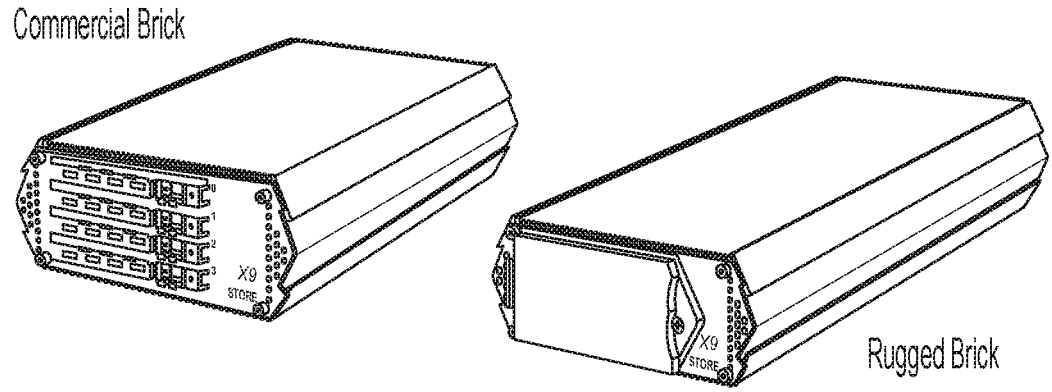
FIG. 17 shows renderings and an electrical schematic for commercial and rugged versions of a stackable storage module according to some embodiments of the present invention.
Figure 17:
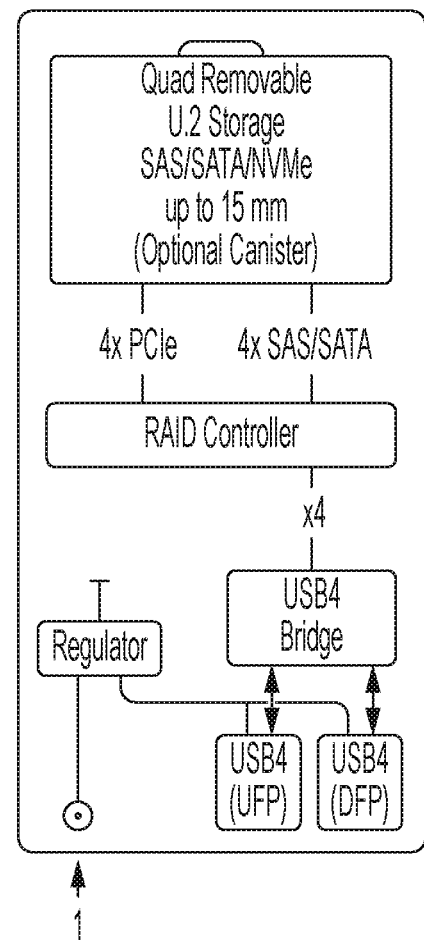

FIG. 17 shows the rendering images of the standalone and stackable storage module in a commercial and rugged brick modular system. The same figure shows an electrical schematic of the standalone and stackable storage module which consists of a quad removable U.2 storage SAS/SATA/NVMe up to 15 mm, 4×PCIe lane, 4×SAS/SATA, RAID Controller, power regulator, and dual USB4 ports.

Stackable Switch Module

The standalone and stackable rugged switch module can support up to 12 ports with ultra-low latency 10 GigE switch and 100/40 GigE Fiber uplink stream connections.

The module contains Intel® Atom™ Processor for Management and Configuration.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems.

Figure 18:
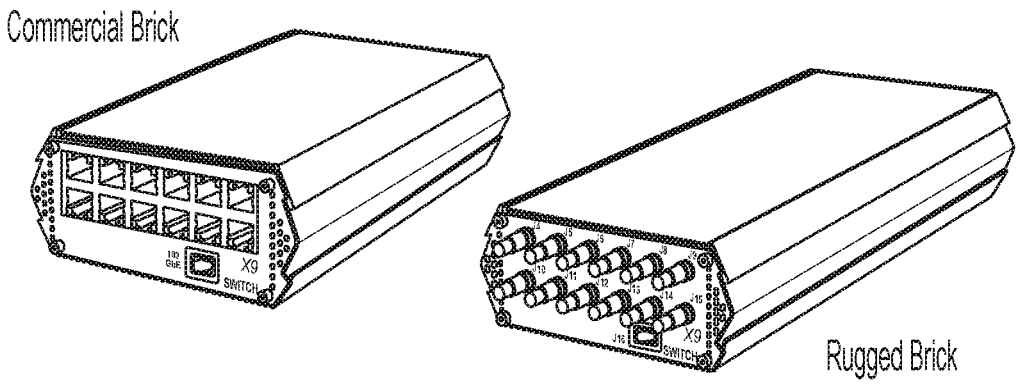
FIG. 18 shows renderings and an electrical schematic for commercial and rugged versions of a stackable switch module according to some embodiments of the present invention.
Figure 18:
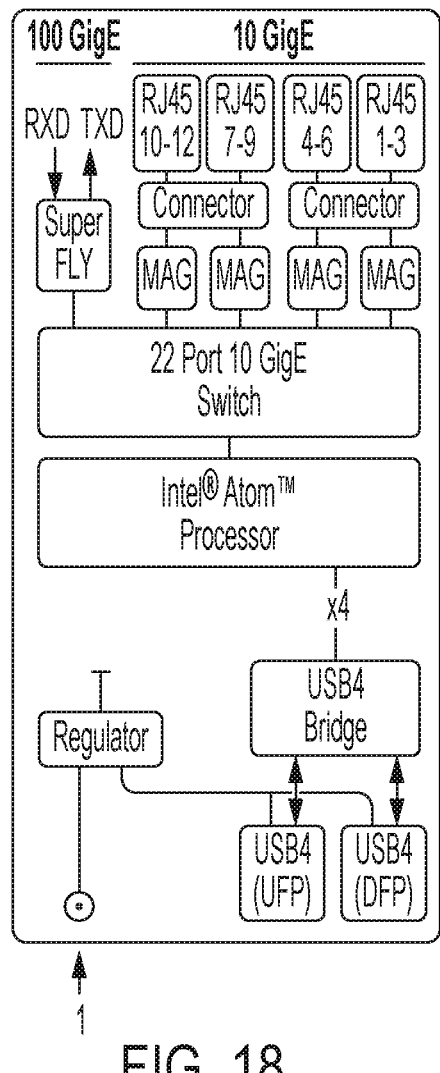

FIG. 18 shows rendering images of the standalone and stackable switch module in a commercial and rugged brick modular system. The same figure shows an electrical schematic of the standalone and stackable switch module which consists of 100 GigE by a super fly connector and 10 GigE ports by RJ45 connectors, switch module, a processor module, power regulator, and dual USB4 ports.

Video Capture Module

The standalone and stackable rugged video capture module is very highly configurable where it can provide up to eight channels of NTSC/PAL connection types.

This module supports two high-definition serial data interfaces (HDSDI) or two digital videos.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems.

Figure 19:
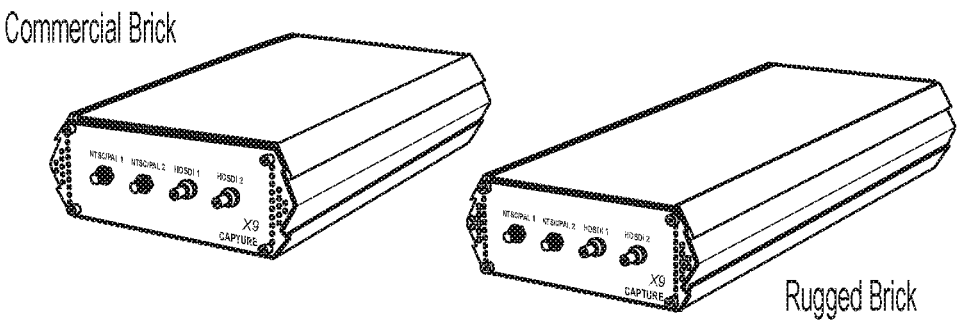
FIG. 19 shows renderings and an electrical schematic for commercial and rugged versions of a stackable video capture module according to some embodiments of the present invention.
Figure 19:
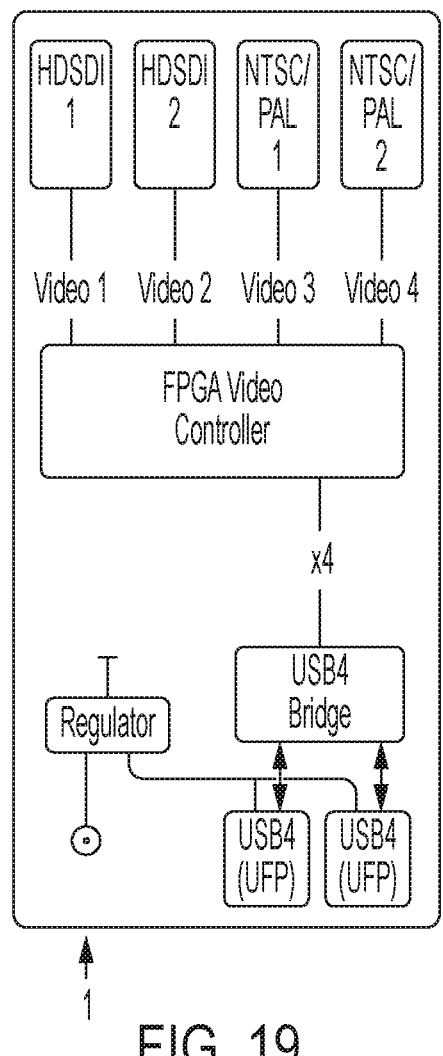

FIG. 19 shows the rendering images of the standalone and stackable video capture module in a commercial and rugged brick modular system. The same figure shows an electrical schematic of the standalone and stackable video capture module which consists of HDSDI with NTSC/PAL, FPGA video controller, power regulator, and dual USB4 ports.

VPX Module

The standalone and stackable rugged VPX module can support dual 3U VPX which makes this unit very versatile.

The slot can support 0.8-inch or 0.85-inch or 1-inch pitch board spacing.

The front and rear both can support high-speed I/O panels.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems.

Figure 20:
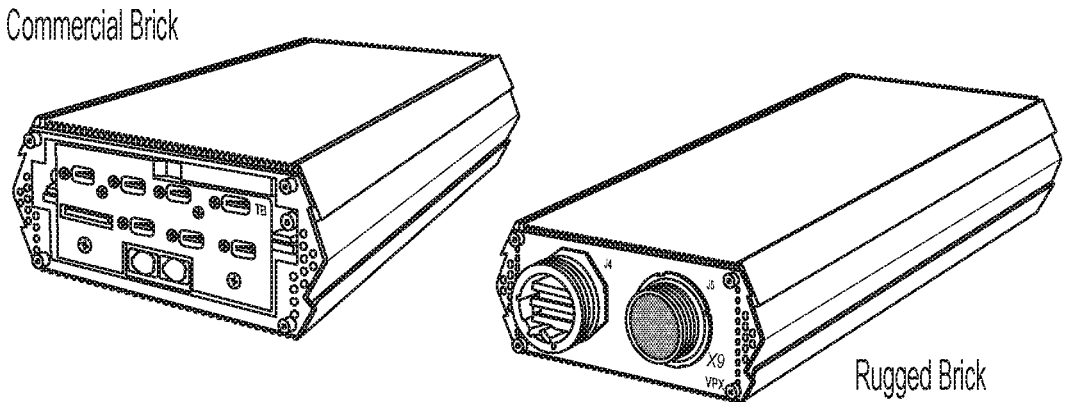
FIG. 20 shows renderings and an electrical schematic for commercial and rugged versions of a stackable VPX module according to some embodiments of the present invention.
Figure 20:
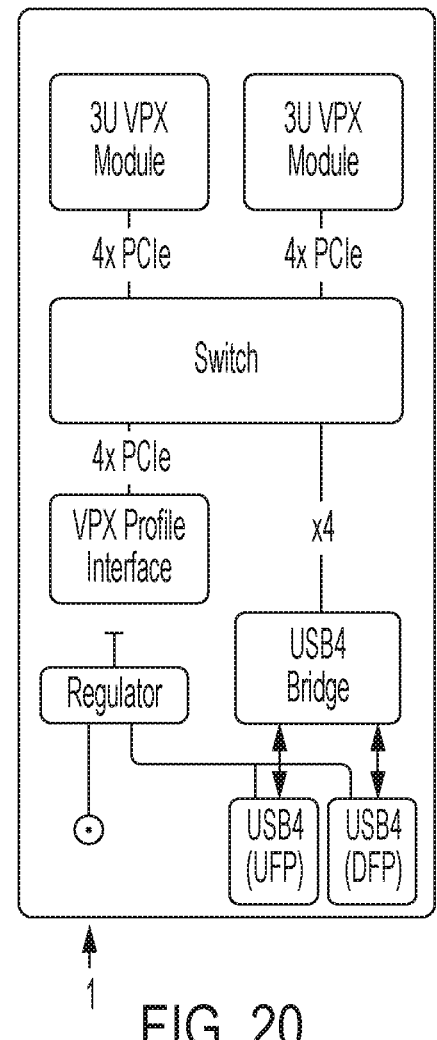

FIG. 20 shows the rendering images of the standalone and stackable VPX module in a commercial and rugged brick modular system. The same figure shows an electrical schematic of the standalone and stackable VPX module which consists of a dual 3U VPX module, 4×PCIe lanes connections, power regulator, and dual USB4 ports.

Stackable Workstation Module

The standalone and stackable rugged workstation module is a highly efficient workstation input/output ("I/O") on the network with high-definition video/audio.

The module supports dual USB 3.0 and dual COM ports with RS232/422/485, and GigE port.

It can be air-cooled or conduction-cooled to dissipate heat generated from the heat source out of the system efficiently.

The USB-C In/Out ports can be built with a power connection, or it can be powered by an external power.

The power module is designed with a voltage and temperature monitoring embedded controller system.

The standalone and stackable module can be ruggedized for extreme environmental conditions or designed as commercial or rack mount systems.

Figure 21:
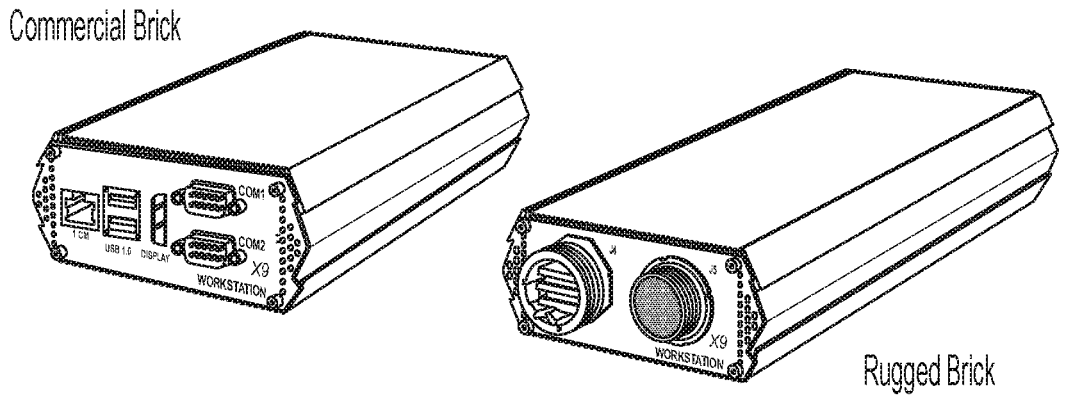
FIG. 21 shows renderings and an electrical schematic for commercial and rugged versions of a stackable workstation module according to some embodiments of the present invention.
Figure 21:
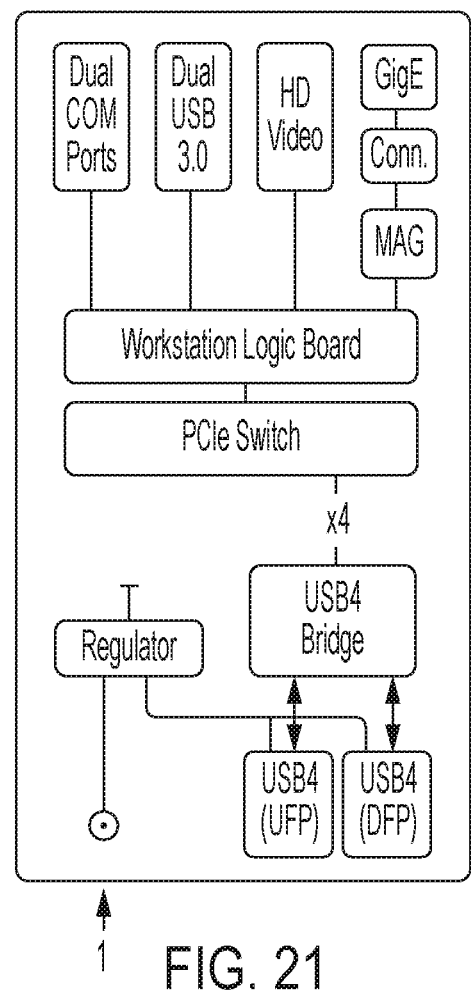

FIG. 21 shows the rendering images of the standalone and stackable workstation module in a commercial and rugged brick modular system. The same figure shows an electrical schematic of the standalone and stackable workstation module which consists of dual COM ports, dual USBs, HD video, GigE port, workstation logic board, PCIe switch, power regulator, and dual USB4 ports.

Although described above in connection with particular hardware configurations and standards, these descriptions are not intended to be limiting as various modifications may be made therein without departing from the spirit of the invention and within the scope and range of equivalent of the described embodiments. Encompassed embodiments of the present invention can be used in all applications where efficient and rugged stackable electronic device configurations are desired.

I claim:

1. A system for stackably assembling a plurality of electronic components, the system comprising:
   a plurality of module enclosures, each of said module enclosure comprising:
       a front panel having at least two perforated grills;
       a rear panel having at least two perforated grills;
       a top panel;
       a bottom panel; and
       side panels which in conjunction with the top and bottom panel form a hexagonal periphery;
   each of the module enclosures further comprising:
       an interior equipment bay adapted to hold an electronic component;
       interlocking structures on the side panels adapted to mate with one or more module enclosures of like construction; and
       at least two interior sections located on opposite sides of and separate from the equipment bay, each of the interior sections comprising one or more interior cooling passageways each extending between one of the perforated grills on said front panel and a corresponding one of the perforated grills on said rear panel to permit cooling air to enter the cooling passageways and cool the electronic component held in the equipment bay located between the two interior sections, each cooling passageway comprising one or more cooling fins.

2. The system of claim 1 wherein the interlocking structures on the side panels are further adapted to provide a cooling conduction cooling pathway between the one or more module enclosures of the system.

3. The system of claim 1 wherein the interlocking structures on the side panels further comprise grooves and tongues adapted to slide and lock the plurality of module enclosures with one another.

4. The system of claim 1 wherein the one or more cooling fins are coated with a thermal conductor coating.

5. The system of claim 4 wherein the thermal conductor coating is a diamond composite.

6. The system of claim 1 wherein the top panel and the bottom panel are each slidably removable.

* * * * *